United States Patent
Deligiannis et al.

(10) Patent No.: US 11,128,282 B2
(45) Date of Patent: Sep. 21, 2021

(54) SAFETY MECHANISM FOR DIGITAL RESET STATE

(71) Applicant: Allegro MicroSystems, LLC, Manchester, NH (US)

(72) Inventors: Sergio Nicolás Deligiannis, Buenos Aires (AR); Lucas Intile, Buenos Aires (AR); Florencia Ferrer, Montevideo (UY)

(73) Assignee: Allegro MicroSystems, LLC, Manchester, NH (US)

( * ) Notice: Subject to any disclaimer, the term of this patent is extended or adjusted under 35 U.S.C. 154(b) by 67 days.

(21) Appl. No.: 16/780,324

(22) Filed: Feb. 3, 2020

(65) Prior Publication Data

US 2021/0239758 A1  Aug. 5, 2021

(51) Int. Cl.
| | |
|---|---|
| *H03K 3/0233* | (2006.01) |
| *G01R 31/3185* | (2006.01) |
| *H03K 3/00* | (2006.01) |
| *H03K 17/22* | (2006.01) |
| *H03K 17/20* | (2006.01) |

(Continued)

(52) U.S. Cl.
CPC ............ *H03K 3/02335* (2013.01); *G01R 31/318525* (2013.01); *G01R 31/318538* (2013.01); *G06F 1/24* (2013.01); *H03K 3/00* (2013.01); *H03K 3/0233* (2013.01); *H03K 3/037* (2013.01); *H03K 17/20* (2013.01); *H03K 17/22* (2013.01)

(58) Field of Classification Search
CPC .. H03K 3/02335; H03K 3/0233; H03K 17/22; H03K 3/037; H03K 17/20; H03K 3/00; G06F 1/24; G01R 31/318525; G01R 31/318538
See application file for complete search history.

(56) References Cited

U.S. PATENT DOCUMENTS

| | | | |
|---|---|---|---|
| 9,739,846 B2 | 8/2017 | Petrie et al. | |
| 10,635,539 B2 | 4/2020 | Cook et al. | |
| 11,016,145 B1* | 5/2021 | Lesser | G01R 31/31727 |
| 2018/0121272 A1* | 5/2018 | Kordik | G06F 11/302 |

(Continued)

OTHER PUBLICATIONS

S. Sarrazin, S. Evain, L. A. de Barros Naviner, Y. Bonhomme and V. Gherman, "Scan design with shadow flip-flops for low performance overhead and concurrent delay fault detection," 2013 Design, Automation & Test in Europe Conference & Exhibition (DATE), Grenoble, France, 2013, pp. 1077-1082. (Year: 2013).*
U.S. Appl. No. 16/251,556, filed Jan. 18, 2019, Forrest et al.
U.S. Appl. No. 16/720,531, filed Dec. 19, 2019, Lesser et al.

*Primary Examiner* — Cynthia Britt
(74) *Attorney, Agent, or Firm* — Daly, Crowley, Mofford and Durkee, LLC (57) ABSTRACT

A system is provided, comprising: a plurality of flip-flops that are configured to receive a reset signal, each of the plurality of flip-flops having a respective output port, and each of the plurality of flip-flops being configured to assume a respective default state when the reset signal is set to a predetermined value; and a reset monitor circuit that is coupled to the respective output port of each of the plurality of flip-flops, the reset monitor circuit being configured to generate a status signal indicating whether each of the flip-flops has assumed the flip-flop's respective default state after the reset signal is set to the predetermined value, wherein assuming a respective default state by each of the plurality of flip-flops results in a predetermined bit string being stored in the plurality of flip-flops.

20 Claims, 6 Drawing Sheets

(51) Int. Cl.
*G06F 1/24* (2006.01)
*H03K 3/037* (2006.01)

(56) References Cited

U.S. PATENT DOCUMENTS

2019/0348138 A1* 11/2019 Mohr ...................... G11C 5/063
2020/0059235 A1*  2/2020 Waldrop ............. G11C 11/4076
2020/0233028 A1*  7/2020 Forrest ................... H01L 22/34

* cited by examiner

SAFETY MECHANISM FOR DIGITAL RESET STATE

BACKGROUND

Integrated Circuits (ICs) are used in a variety of applications, many of which have strict accuracy and reliability requirements due to their use in safety-critical applications such as automotive applications. As digital IC geometries become smaller and signal speeds become faster, fault testing becomes more challenging. Various fault conditions such as marginal contacts, vias, and/or interconnects can cause signal delay and other types of faults. Testing of digital circuitry can be a valuable tool in safety-critical applications to ensure that the digital circuitry is operating correctly.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a system is provided, comprising: a plurality of flip-flops that are configured to receive a reset signal, each of the plurality of flip-flops having a respective output port, and each of the plurality of flip-flops being configured to assume a respective default state when the reset signal is set to a predetermined value; and a reset monitor circuit that is coupled to the respective output port of each of the plurality of flip-flops, the reset monitor circuit being configured to generate a status signal indicating whether each of the flip-flops has assumed the flip-flop's respective default state after the reset signal is set to the predetermined value, wherein assuming a respective default state by each of the plurality of flip-flops results in a predetermined bit string being stored in the plurality of flip-flops.

According to aspects of the disclosure, a system is provided, comprising: a plurality of flip-flops that are configured to receive a reset signal, each of the plurality of flip-flops having a respective output port, and each of the plurality of flip-flops being configured to assume a respective default state when the reset signal is set to a predetermined value; a reset monitor circuit that is coupled to the respective output port of each of the plurality of flip-flops, the reset monitor circuit being configured to generate a status signal indicating whether each of the flip-flops has assumed the flip-flop's respective default state after the reset signal is set to the predetermined value; and a testing circuitry configured to detect whether the reset signal is set to the predetermined value, and transition the system into a predetermined state when the status signal generated by the reset monitor circuit indicates that at least one of the plurality of flip-flops has failed to assume the flip-flop's respective default state in response to the reset signal being set to the predetermined value.

According to aspects of the disclosure, a sensor is provided comprising: a transducer; a processing circuitry coupled to the transducer, the processing circuitry being configured to digitally process a signal that is generated using the transducer; a scan chain for testing the processing circuitry, the scan chain including plurality of flip-flops that are configured to receive a reset signal, each of the plurality of flip-flops having a respective output port, and each of the plurality of flip-flops being configured to assume a respective default state when the reset signal is set to a predetermined value; and a reset monitor circuit that is coupled to the respective output port of each of the plurality of flip-flops, the reset monitor circuit being configured to generate a status signal indicating whether each of the flip-flops in the scan chain has assumed the flip-flop's respective default state after the reset signal is set to the predetermined value; a testing circuitry configured to detect that the reset signal is set to the predetermined value, and transition the sensor into a predetermined state when the status signal indicates that at least one of the plurality of flip-flops has failed to assume the flip-flop's respective default state, wherein assuming a respective default state by each of the plurality of flip-flops results in the scan chain being reset to a state in which a predetermined bit string is stored in the scan chain.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1A:
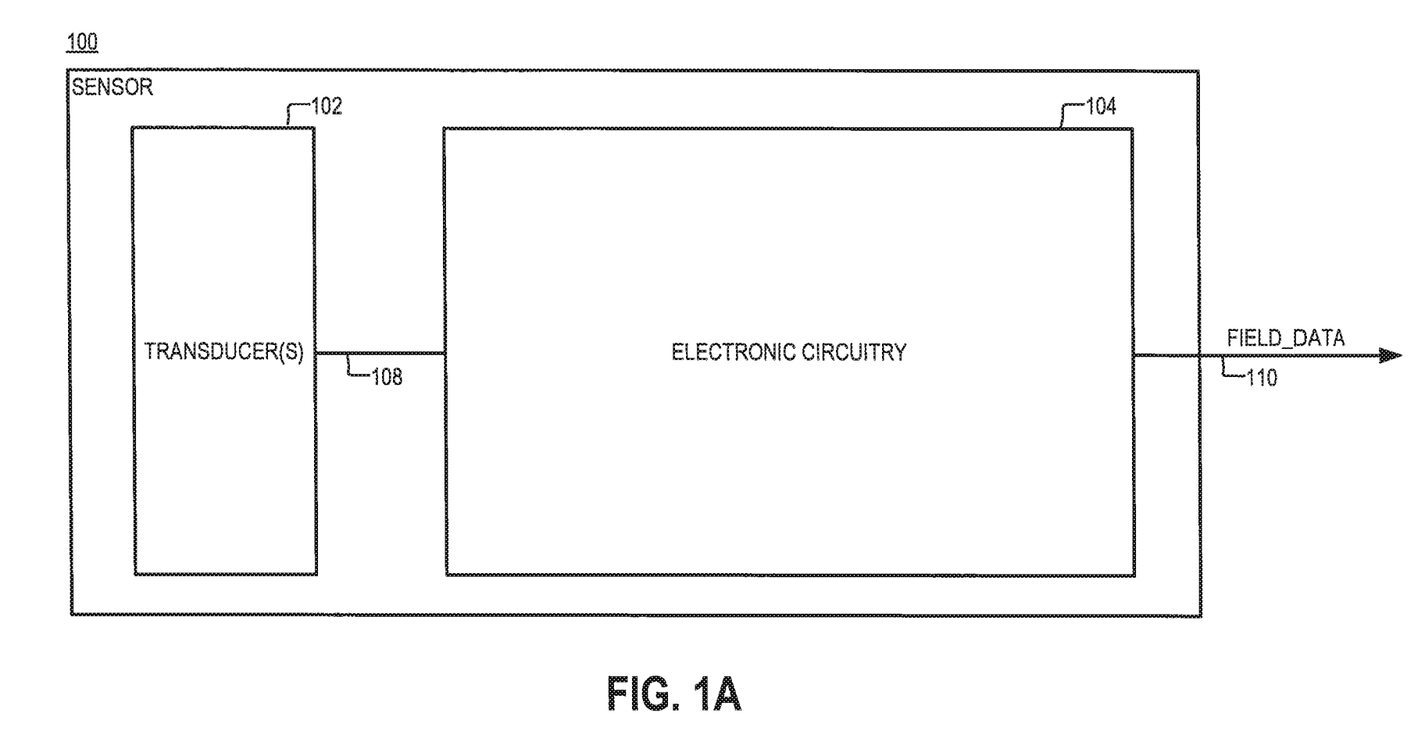
FIG. 1A is a diagram of an example of a sensor, according to aspects of the disclosure.

FIG. 1A is a diagram of an example of a sensor 100, according to aspects of the disclosure. The sensor 100 may include a magnetic field sensor, an optical sensor, and or any other suitable type of sensor. The sensor 100 may include one or more transducers 102 coupled to electronic circuitry 104. The transducers 102 may include any suitable type of sensing element, such as a magnetic field sensing element (e.g., a Hall effect element, a giant magnetoresistance (GMR) element, a tunnel magnetoresistance element (TMR), etc.), an optical sensor (e.g., a photodiode), a pressure sensor, an acoustic sensor (e.g., a microphone), etc. The electronic circuitry 104 may include one or more amplifiers, signal mixers, analog-to-digital converters, digital processing circuitry, and/or any other suitable type of circuitry that may be found in electronic sensors.

In operation, the transducers 102 may generate a first signal 108 (e.g., an analog signal) and provide the first signal 108 to the electronic circuitry 104. The electronic circuitry 104 may generate a second signal 110 (e.g., a digital signal) based on the first signal 108. The second signal may include any suitable type of signal that is normally generated by digital sensors. For example, if the sensor 100 is a magnetic sensor, the second signal 110 may identify one or more of a (1) flux density of a magnetic field, a (2) direction of a magnetic field, (3) a speed of rotation of a target, (4) an angular displacement of a target, (5) a measured current level, etc. As another example, if the sensor 100 is an optical sensor, the second signal 110 may identify one or more of the intensity of light that is incident on the sensor 100 and/or color of the light, etc. As yet another example, if the sensor 100 is an acoustic sensor, the second signal 110 may be a digital audio signal, etc.

Figure 1B:
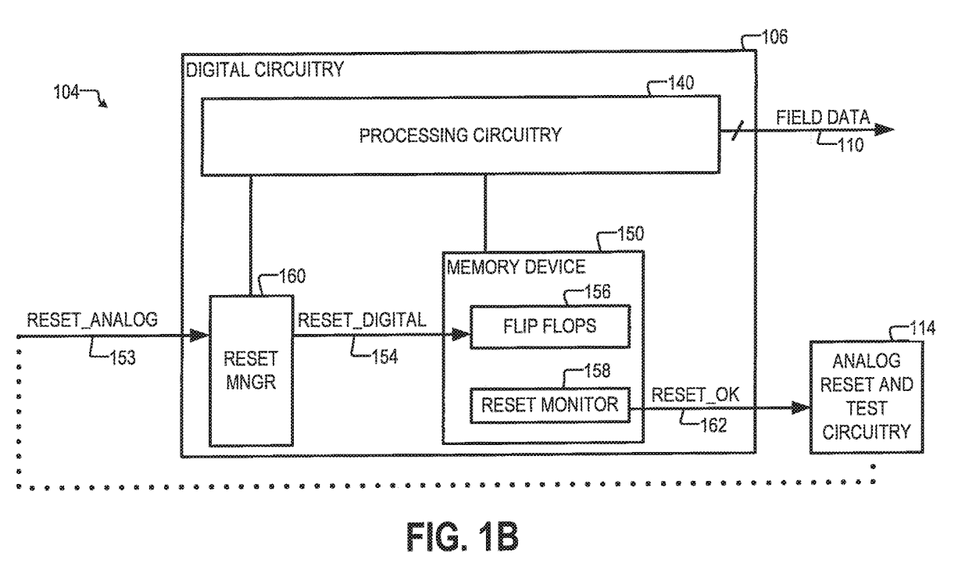
FIG. 1B is a diagram showing an electronic circuitry of the sensor of FIG. 1A in further detail, according to aspects of the disclosure.

FIG. 1B is a diagram illustrating aspects of the electronic circuitry 104 in further detail, according to one implementation. As illustrated, the electronic circuitry 104 may include a digital circuitry 106 that is coupled to an analog reset-and-test circuitry 114. The digital circuitry 106 may include a processing circuitry 140, a memory device 150, and a reset manager 160. The processing circuitry 140 may include any suitable type of digital electronic circuitry, such as one or more of a digital signal processor, combinatorial logic, an arithmetic-and-logic unit (ALU), a general-purpose processor, a special-purpose processor, etc. For example, in some implementations, the processing circuitry 140 may include only combinational logic and no memory elements.

The memory device 150 may include a plurality of flip-flops 156 and a reset monitor 158. As is discussed further below with respect to FIGS. 2A-3C, each of the plurality of flip-flops 156 may be configured to receive a RESET_DIGITAL signal 154 from the reset manager 160. When the RESET_DIGITAL signal 154 is set to the predetermined value (e.g., a logic-high value), each of the plurality of scan flip-flops may assume a respective default state and the memory device 150 may be reset. For example, one or more of the plurality of flip-flops 156 may begin to store a logic-high value when the RESET_DIGITAL signal 154 is set to the predetermined value. As another example, one or more of the plurality of flip-flops 156 may begin to store a logic-low value when the RESET_DIGITAL signal 154 is set to the predetermined value. In some respects, the assumption of a respective default state by each of the plurality of flip-flops 156 may be referred to as "resetting" of the plurality of flip-flops 156 and/or the memory device 150.

The reset monitor 158 may include any suitable type of electronic circuitry that is configured to detect whether the memory device 150 (and/or the plurality of flip-flops 156) has been reset correctly after the RESET_DIGITAL signal 154 is set to the predetermined value (e.g., a logic-high value). As illustrated, the reset monitor 158 may be configured to output a RESET_OK signal 162 (e.g. a status signal) that indicates whether the memory device 150 (and/or the plurality of flip-flops 156) has been reset correctly after the RESET_DIGITAL signal 154 is set to the predetermined value (e.g., a logic high value). When the memory device 150 (and/or the plurality of flip-flops 156) has been reset correctly, the RESET_OK signal 162 may have a first value (e.g., a logic-high value). On the other hand, when the memory device 150 (and/or the plurality of flip-flops 156) has not been reset correctly, the RESET_OK signal 162 may have a second value (e.g., a logic-low value). The RESET_OK signal 162 may be used by the circuitry 114 to detect faults in the memory device 150 that result in the memory device not being reset correctly. Such faults may be caused by a manufacturing defect or by stress that is imparted on the memory device 150 during installation or normal operation of the sensor 100.

The reset manager 160 may include any suitable type of digital circuitry that is configured to receive a RESET_ANALOG signal 153 from the circuitry 114 (and/or another manager of the electronic circuitry 104) and generate the RESET_DIGITAL signal 154 based on the RESET_ANALOG signal 153. In some implementations, when the RESET_ANALOG signal 153 exceeds a voltage threshold, the reset manager 160 may set the RESET_DIGITAL signal 154 to the predetermined value (e.g., a logic-high value), which causes the memory device 150 to be reset. The circuitry 114 may include any suitable type of analog circuitry that is configured to provide the RESET_ANALOG signal 153 to the reset manager 160. Furthermore, in some implementations, the circuitry 114 may include testing circuitry that is configured to monitor the value of the RESET_OK signal 162 and transition the sensor 100 into a safe state when the RESET_OK signal 162 indicates that the memory device 150 has not been reset correctly. In some implementations, the reset manager 160 may reset the memory device synchronously with the clock signal that is driving the memory device. For example, in some implementations, the reset manager 160 may set the RESET_DIGITAL signal 154 to the predetermined value at the next rising edge of the clock signal (that is driving the memory device 150). Additionally or alternatively, in some implementations, the reset manager 160 may wait for two or more clock cycles (after detecting that the RESET_ANALOG signal 153 exceeds the voltage threshold) before setting the RESET_DIGITAL signal 154 to the predetermined value.

Figure 1C:
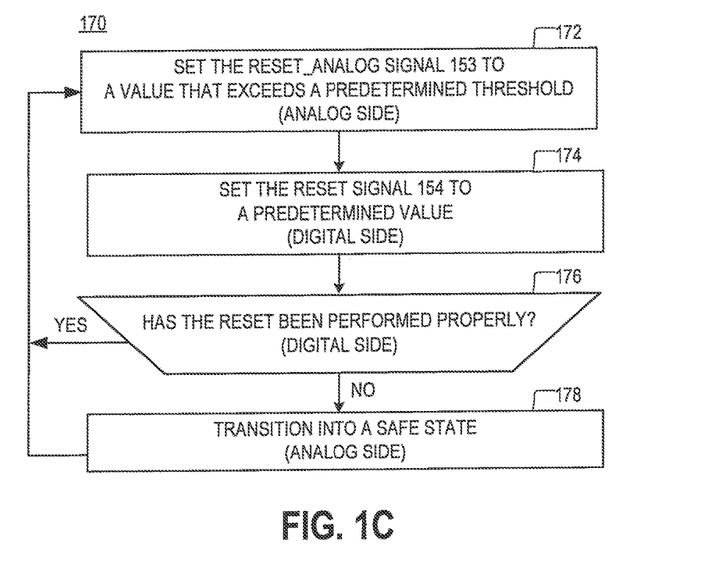
FIG. 1C is a flowchart of an example of a process that is performed by the electronic circuitry of the sensor of FIG. 1A, according to aspects of the disclosure.

FIG. 1C is a flowchart of an example of a process 170 that is performed by the electronic circuitry 104, according to aspects of the disclosure. At step 172, the circuitry 114 sets the RESET_ANALOG signal 153 to a value that exceeds a predetermined voltage threshold. At step 174, the reset manager 160 detects that the RESET_ANALOG signal 153 is set to a value that exceeds the predetermined threshold, and sets the RESET_DIGITAL signal 154 to the predetermined value (e.g., a logic-high value), which causes the memory device 150 to be reset. At step 176, the reset monitor 158 outputs the RESET_OK signal 162, which indicates whether or not the memory device 150 has been reset correctly. At step 178, the circuitry 114 determines whether the RESET_OK signal indicates that the memory device 150 has been reset correctly. If the memory device 150 has been reset correctly, the process 170 returns to step 172. Otherwise, if the memory device 150 has not been reset correctly, the process 170 proceeds to step 178. At step 178, the circuitry 114 transitions the sensor 100 into a safe state. Transitioning the sensor 100 into the safe state may include outputting a signal indicating that the reset operation (triggered by the RESET signal 154) has failed. Additionally or alternatively, in some implementations, transitioning the sensor 100 into the safe state may include repeating the reset operation. Additionally or alternatively, in some implementations, transitioning the sensor 100 into a safe state may include disabling the memory device 150. Additionally or alternatively, in some implementations, transitioning the sensor 100 into a safe state may include putting to high impedance any output port, such as a PWM port, a SENT port, or an analog output port. Those of ordinary skill in the art would readily recognize, after reading the present disclosure, that a variety of actions can be taken when the RESET_OK signal 162 indicates that the memory device 150 has not been reset correctly. In this regard, it will be understood that the present disclosure is not limited to taking any specific action when the RESET_OK signal 162 indicates that the memory device 150 has not been reset correctly.

Figure 2A:
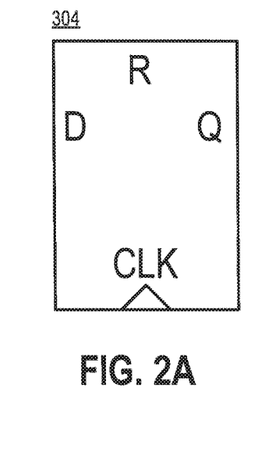
FIG. 2A is a diagram of an example of a flip-flop, according to aspects of the disclosure.

FIG. 2A is a diagram of an example of a flip-flop 304 that can be used to implement one or more of the plurality of flip-flops 156. As illustrated, the flip-flop 304 may include a data port D, a reset port R, an output port Q, and a port CLK for receiving a clock signal. The flip-flop 304 may be implemented by using a D-type flip-flop with a set/reset capability and/or any other suitable type of flip-flop. In this regard, it will be understood that the present disclosure is not limited to any specific implementation of the flip-flop 304.

Figure 2B:
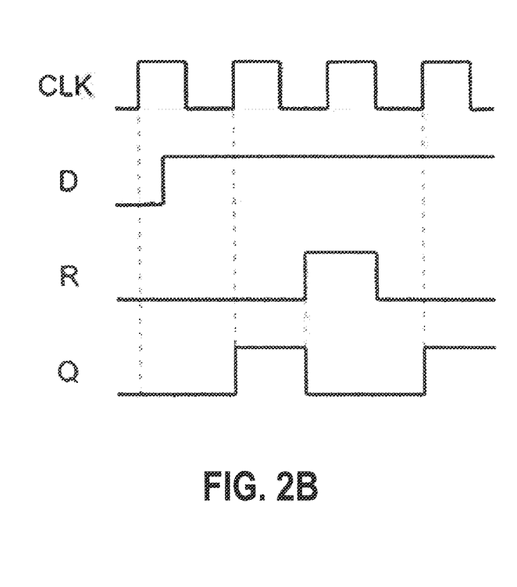
FIG. 2B is a waveform diagram illustrating the operation of the flip-flop of FIG. 2A, according to aspects of the disclosure.

FIG. 2B is a waveform diagram illustrating the operation (and/or configuration) of the flip-flop 304 in further detail. As illustrated, when a signal having a logic-high value is applied at the input port D of the flip-flop 304, the signal output from the output port Q assumes a logic-high value at the next rising edge of the clock signal; when a signal having a logic-low value is applied at the input port D of the flip-flop 304, the signal output from the output port Q assumes a logic-low value at the next rising edge of the clock signal. When a signal having a logic-high value is applied at the reset port R, the signal output from the output port Q asynchronously assumes a logic-low value and remains in this state until the signal applied at the reset port R returns to a logic-low value. As illustrated in FIG. 2B, the signal output from the output port Q may assume a logic high value at the rising edge of the clock cycle following the return of the signal applied at the reset port R to a logic-low value (provided that the signal applied at the port D is at a logic-high value). As can be readily appreciated, applying a logic-high signal at the reset port R overrides any signal that is being applied at the input port D of the flip-flop 304 and effectively causes the flip-flop 304 to transition into a default state in which the flip-flop 304 stores a logic-low value (e.g., '0'). Although in the present example, the flip-flop 304 is reset asynchronously, in other implementations, the flip-flop 304 may be reset synchronously.

Figure 2C:
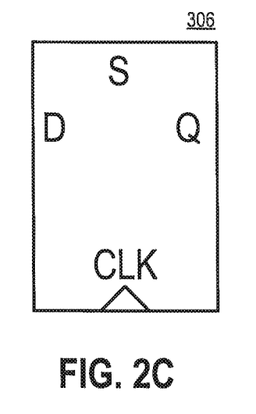
FIG. 2C is a diagram of another example of a flip-flop, according to aspects of the disclosure.

FIG. 2C is a diagram of an example of a flip-flop 306 that can be used to implement one or more of the plurality of flip-flops 156. As illustrated, the flip-flop 306 may include a data port D, a set port S, an output port Q, and a port CLK for receiving a clock signal. The flip-flop 306 may be implemented by using a D-type flip-flop with a set/reset capability and/or any other suitable type of flip-flop. In this regard, it will be understood that the present disclosure is not limited to any specific implementation of the flip-flop 306.

Figure 2D:
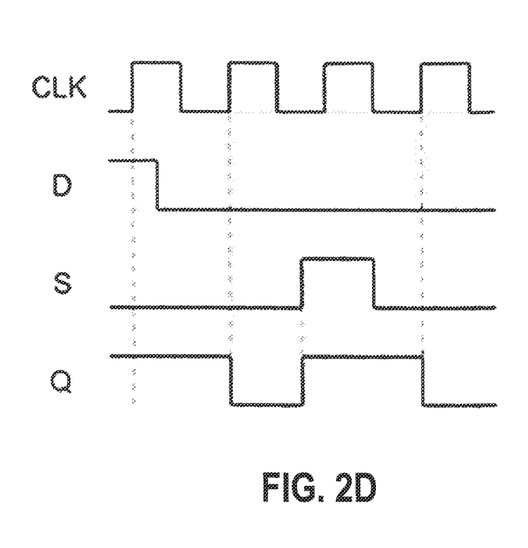
FIG. 2D is a waveform diagram illustrating the operation of the flip-flop of FIG. 2C, according to aspects of the disclosure.

FIG. 2D is a waveform diagram illustrating the operation (and/or configuration) of the flip-flop 306 in further detail. According to the example of FIGS. 2C-D, when a signal having a logic-high value is applied at the input port D of the flip-flop 306, the signal output from the output port Q assumes a logic-high value at the next rising edge of the clock signal. When a signal having a logic-low value is applied at the input port D, the signal output from the output port Q assumes a logic-low value at the next rising edge of the clock signal. When a signal having a logic-high value is applied at the set port S, the signal output from the output port Q asynchronously assumes a logic-high value and remains in this state until the signal applied at the set port S returns to a logic-low value. As illustrated in FIG. D, the signal output from the output port Q may assume a logic low value at the rising edge of the clock cycle following the return of the signal applied at the set port S to a logic-low value (provided that the signal applied at the port D is at a logic-low value, as well). As can be readily appreciated, applying a logic-high signal at the set port S overrides any signal that is being applied at the input port D of the flip-flop 304 and effectively causes the flip-flop 306 to transition into a default state in which the flip-flop 306 stores a logic-high value (e.g., '1'). Although in the present example the flip-flop 304 is reset asynchronously, in other implementations, the flip-flop 304 may be reset synchronously.

Figure 3A:
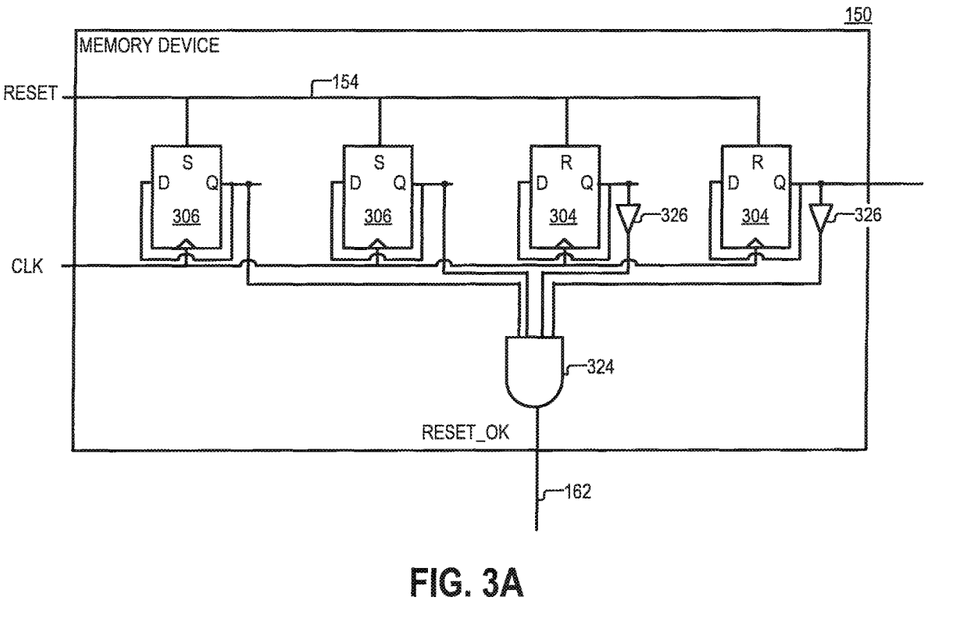
FIG. 3A is a diagram of an example of a memory device, according to aspects of the disclosure.
Figure 3B:
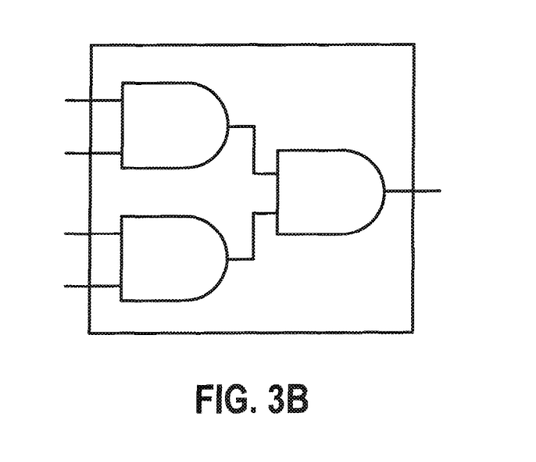
FIG. 3B is a diagram of an example of an AND gate, according to aspects of the disclosure.

FIG. 3A shows an example of one possible implementation of the memory device 150, according to aspects of the disclosure. According to the example of FIG. 3A, the plurality of flip-flops 156 may include one or more flip-flops 304 and one or more flip-flops 306 that are coupled in series to one another. The reset port R of each of the flip-flops 304 may be arranged to receive the RESET_DIGITAL signal 154, and the set port S of each of the flip-flops 306 may also be arranged to receive the RESET_DIGITAL signal 154. As noted above, when the RESET_DIGITAL signal 154 is set to a predetermined value (e.g., a logic-high value), each of the flip-flops 304 may transition into a state (e.g., a first default state) in which it stores the bit value of '0', and each of the flip-flops 306 may transition into a state (e.g., a second default state) in which stores the bit value of '1'.

The reset monitor may include an AND gate 324 and a plurality of NOT gates 326.

The AND gate 324 may include a plurality of input ports, wherein each of the input ports is coupled to the output port Q of a different one of the flip-flops 304 and 306. As illustrated, the output port Q of each of the flip-flops 304 may be coupled to a respective input port of the AND gate 324 without using any NOT gates. And the output port Q of each of the flip-flops 306 may be coupled to a different input port of the to an AND gate 326 via a respective NOT gate 326. As a result of this arrangement, the signal output from each of the flip-flops 306 is provided to the AND gate 324 without being inverted, whereas the signal output from each of the flip-flops 304 is inverted before it is provided to the AND gate 324. Accordingly, when each of the flip-flops 304 and 306 is set/reset correctly, after the RESET signal 154 is set to a predetermined value (e.g., a logic-high value), the RESET_OK signal 162, which is output from the AND gate 324, may have a first value (e.g., a logic-high value). By contrast, when one or more of flip-flops 304 and 306 is not set/reset correctly (e.g., due to a fault in the flip-flop), the RESET_OK signal 162, which is output from the AND gate 324, may have a second value (e.g., a logic-low value).

As illustrated, the Q port of each of the flip-flops 304 may be coupled to that flip-flop's respective D port via a respective feedback line. Similarly, the Q port of each of the flip-flops 306 may be coupled to that flip-flop's respective D port via a feedback line. In this regard, in the example of FIG. 3A, the memory device 150 may be essentially arranged to operate as a read-only memory that is hardwired to store a predetermined bit string. As can be readily appreciated, the value of the bit string is determined by the order in which the flip-flops 304 and 306 are arranged. In the example of FIG. 3A, this value is "1100". In this regard, the RESET_DIGITAL signal 154, when set to the predetermined value (e.g., a logic-high value), causes the memory device 150 to assume a state in which the default bit string is stored in the memory device 150. Moreover, because, with time, the state of each of the flip-flops 304 and 306 may drift, it may be necessary to occasionally reset the flip-flops 306 and 304 to ensure that the (correct) bit string remains stored in the memory device 150. Although in the example of FIG. 3A, the memory device 150 may be configured to store other bit strings (in addition to the default bit string) that are loaded into the memory device 150 via the respective D ports of the flip-flops 304 and 306. In this regard, it will be understood that the present disclosure is not limited to any specific topology for wiring the D ports (and/or Q ports) of the flip-flops 304 and 306.

FIG. 3A is provided as an example only. In this regard, it will be understood that the present disclosure is not limited to any specific configuration of the reset monitor 158. For instance, in some implementations, the AND gate 324 can be implemented as a network of AND gates (e.g., see FIG. 3B). Additionally or alternatively, in some implementations, the NOT gates 314 may be integrated into the AND gate 324 to form an AND gate with inverted inputs. Although FIG. 3A depicts the flip-flops 304 and 306 as being divided into separate groups, it will be understood that in some implementations the flip-flops 304 and 306 may be interleaved with one another. In this regard, it will be understood that the present disclosure is not limited to any specific ordering of the flip-flops 304 and 306 in the memory device 150.

According to the example of FIG. 3A, the memory device 150 includes two flip-flops 304 and two flip-flops 306. However, alternative implementations are possible in which the memory device includes any number of flip-flops 304 or no flip-flops 304 at all. Furthermore, alternative implementations are possible in which the memory device 150 includes any number of flip-flops 306 or no flip-flops 306 at all. In this regard, it will be understood that the present disclosure is not limited to implementing the memory device 150 with any specific type and/or number of flip-flops.

According to aspects of the disclosure, the memory device 150 is suitable for use in various safety-critical applications, where ineffective reset on digital flip flops may have unpredictable consequences, and where reporting safety mechanisms may be needed in order to prevent the uncontrolled propagation of the failure. In order to achieve high diagnostic coverage (above 99%, e.g., as per Functional Safety for Road vehicles standard) in detection of effective digital reset execution, the memory device needs to include at least four flip flops 304 and at least four flops 306. According to the present example, the phrase "coverage of the memory device 150" refers to the probability of the RESET_OK signal 162 indicating that the memory device 150 has been reset correctly, when this is not the case. In this regard, as can be readily appreciated, the coverage of the memory device 150 measures the probability of the RESET_OK signal 162 indicating the state of the memory device 150 correctly.

A coverage analysis for the memory device 150 is now provided. The coverage of the memory device 150 can be defined as follows:

$$\text{Coverage}=1-P_0^{N_0} \times P_1^{N_1} \quad (1)$$

where $P_0=1-P=$probability of $Q_i$ being '0' when there is no reset, $Q_i$ is the output of the i-th flip-flop in the memory device 150 (either a flip-flop 304 or a flip-flop 306), $P_1=P=$probability of $Q_i$ being '1' when there is no reset (e.g., when the RESET_DIGITAL signal 154 is at a logic-low value), $N_0$ is the number of flip-flops 306 in the memory device 150 (and/or the plurality of flip-flops 156), and $N_1$ is the number of flip-flops 304 in the memory device 150 (and/or the plurality of flip-flops 156). In some respects, the term $P_0^{N_0}$ measures the probability of the AND gate 324 receiving a correct signal from one of the flip-flops 306 when the flip-flop (or circuitry driving the flip-flop) has malfunctioned. Similarly, the term $P_1^{N_1}$ measures the probability of the AND gate 324 receiving a correct signal from one of the flip-flops 306 when the flip-flop (or circuitry driving the flip-flop) has malfunctioned.

The number $N_0$ of flip-flops 306 and the number $N_1$ of flip-flops 304 can be defined as follows:

$$N_0=N_1=N \quad (2)$$

Applying the above definitions, Equation 1 can be re-written as follows:

$$\text{Coverage}=1-(1-P)^N \times P^N=1-(P-P^2)^N \quad (3)$$

Based on Equation 3, the worst coverage will occur when $P-P^2$ is at its maximum, or when $P=0.5$:

$$\max(P-P^2)=0.25, \text{when } P=0.5 \quad (4)$$

Because compliance with the D-level of the Automotive Safety Integrity Level (ASIL) standard requires 99% coverage, the worst coverage of the memory device 150 must be less than 0.99:

$$0.99 < \text{worst coverage}=1-0.25^N \quad (5)$$

Based on Equation 5, the value of N (number of flip-flops in the plurality of flip-flops 156) can be expressed as follows:

$$N > \left(\frac{\ln(0.01)}{\ln(0.25)}\right) = 3.3219 \quad (6)$$

In other words, as illustrated by Equation 6, to achieve ASIL D compliance, the memory device 150 needs to have at least four flip-flops 304 and at least four flip-flops 306.

In some implementations, the memory device 150 may be part of a scan chain that is implemented at least in part by the digital circuitry 106. In such implementations, the memory device 150 may be used to store a test signature. The test signature may be applied at the beginning of a testing sequence that is executed by the scan chain. The testing sequence may be executed to confirm that the sensor 100 is working correctly. In some implementations, when the memory device 150 is used as part of a scan chain, the memory device 150 may be implemented by using a plurality of scan flip-flops. Each of the scan flip-flops may include a respective one of the flip-flops 304 and 306, which are discussed above with respect to FIGS. 3-6.

Figure 4A:
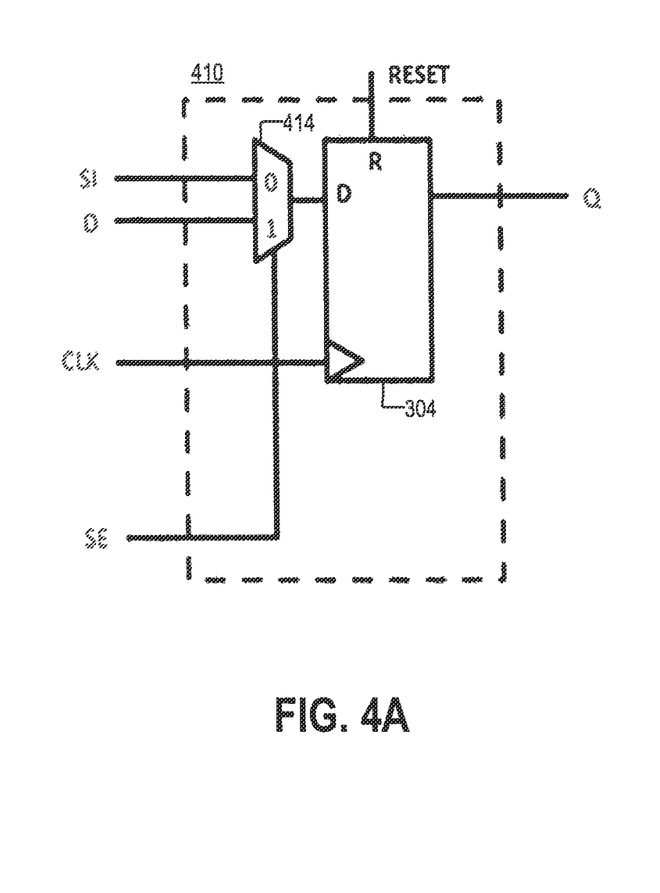
FIG. 4A is a diagram of an example of a scan flip-flop that incorporates the flip-flop of FIG. 2A, according to aspects of the disclosure.
Figure 4B:
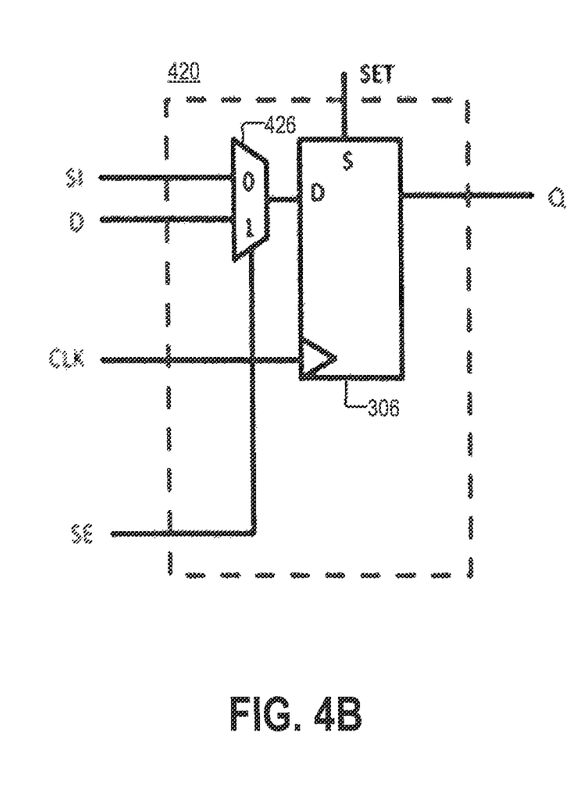
FIG. 4B is a diagram of an example of a scan flip-flop that incorporates the flip-flop of FIG. 2C, according to aspects of the disclosure.

FIG. 4A shows an example of a scan flip-flop 410. As illustrated, the scan flip-flop 410 may include a flip-flop 304 and a 2-to-1 multiplexer 414. As illustrated, the data port D of the flip-flop 304 may be coupled to the output port of the multiplexer 414. The input ports of the multiplexer may be arranged to receive a scan-in signal (SI) and a data signal (D), and the selection port of the multiplexer may be arranged to receive a scan-enable signal (SE). FIG. 4B shows an example of a scan flip-flop 420. As illustrated, the scan flip-flop 420 may include a flip-flop 306 and a 2-to-1 multiplexer 426. As illustrated, the data port D of the flip-flop 306 may be coupled to the output port of the multiplexer 426. The input ports of the multiplexer may be arranged to receive a scan-in signal (SI) and a data signal (D), and the selection port of the multiplexer may be arranged to receive a scan-enable signal (SE). The scan flip-flops 410 and 420 are provided as an example only. Those of ordinary skill in the art will readily recognize that there are a variety of ways to implement scan flip-flops or a scan chain. In this regard, it will be understood that the present disclosure is not limited to any specific method for implementing a scan flip-flop or a scan chain with the flip-flops 304 and 306.

Figure 5:
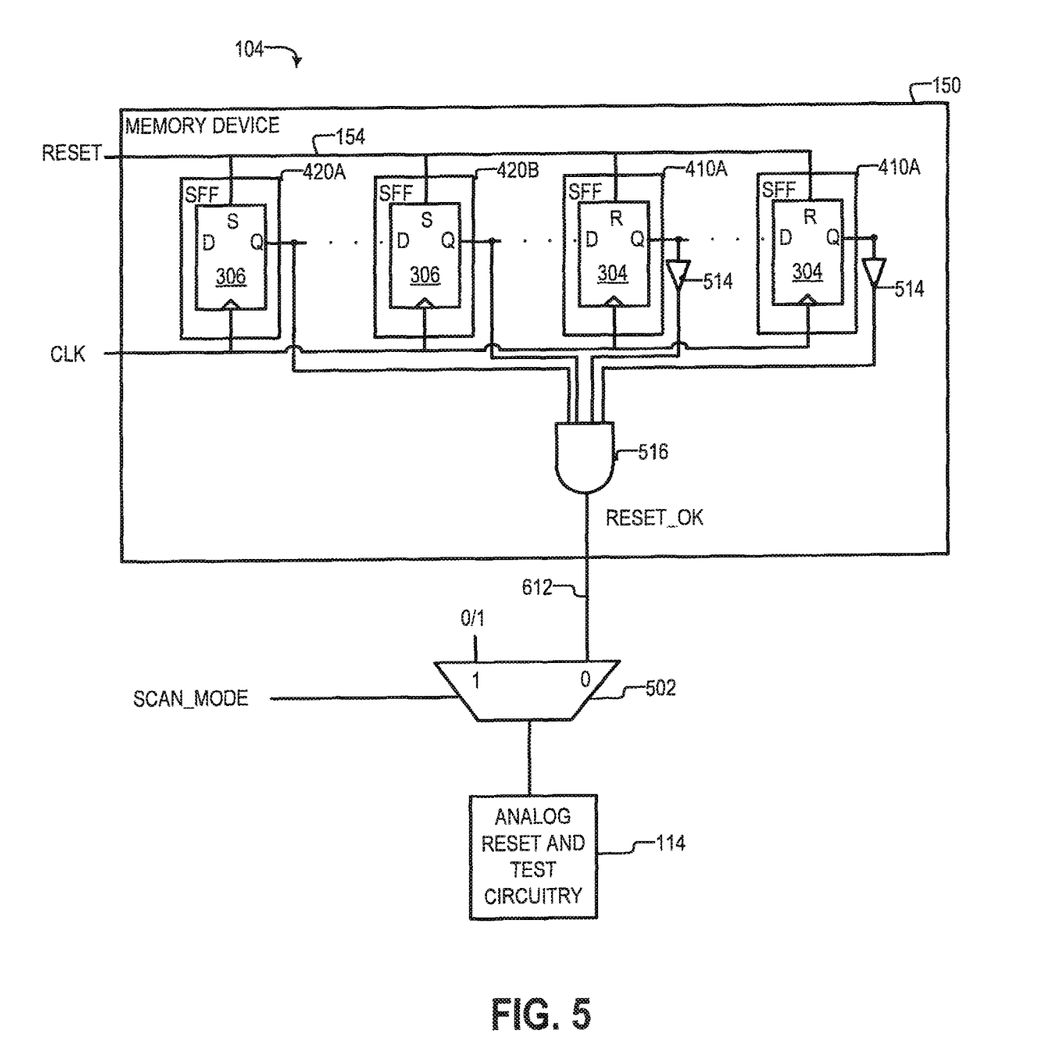
FIG. 5 is a diagram of an example of a memory device that is part of a scan chain, according to aspects of the disclosure.

FIG. 5 is a diagram illustrating another possible implementation of the memory device 150, according to aspects of the disclosure. The implementation of the memory device 150, which is depicted in FIG. 5, can be used in a scan chain for testing the operation of the sensor 100. In some implementations, the operation of the scan chain may have three stages: Scan-in, scan-capture, and scan-out. Scan-in may involve loading the plurality of flip-flops 156 with an initial test signature (e.g., an input vector). During scan-capture, combinatorial logic (which is part of the processing circuitry 140) may be excited and data that is output by the combinatorial logic may be captured at one or more of the plurality of flip-flops 156. During scan-out, data is stored in the scan chain, after the output of the combinatorial logic output is captured, may be provided to analog or digital testing circuitry that is part of the electronic circuitry 104 for use in determining whether the processing circuitry 140 is operating correctly. Unlike memory devices that are used in conventional scan chains (e.g., flip-flop arrays, etc.), the memory device 150 may include a reset monitor 158. Including the reset monitor 158 in the memory device 150 is advantageous because the RESET_OK signal 162, which is generated by the reset monitor 158, can be used to detect faults caused by defects in the memory device 150 and/or the circuitry that is driving the RESET_DIGITAL signal 154.

As illustrated in FIG. 5, the plurality of flip-flops 156 may include scan flip-flops 410A-B and scan flip-flops 420A-B that are coupled in series to one another. Each of the scan flip-flops 410 may include a respective flip-flop 304, and each of the scan flip-flops 420 may include a respective flip-flop 306. The reset port R of each of the flip-flops 304 may be arranged to receive the RESET_DIGITAL signal 154, and the set port S of each of the flip-flops 306 may also be arranged to receive the RESET_DIGITAL signal 154. As noted above, when the RESET_DIGITAL signal 154 is set to a predetermined value (e.g., a logic-high value), each of the flip-flops 304 may transition into a state (e.g., a first default state) in which it stores the bit value of '0', and each of the flip-flops 306 may transition into a state (e.g., a second default state) in which stores the bit value of '1'. In other words, as noted above, setting the RESET_DIGITAL signal 154 to the predetermined value may cause the scan chain 150 to store a predetermined bit string, which can be subsequently used as an initial test signature for a given test sequence.

In some implementations, each of the scan flip-flops 410A-410B and 420A-B may be coupled to receive the same signal SI (see FIGS. 4A-B). Alternatively, in some implementations, at least two of the scan flip-flops 410A-B and 420A-B may be arranged to receive different signals SI (see FIGS. 4A-B). In some implementations, each of the scan flip-flops 410A-410B and 420A-B may be coupled to receive the same signal SE (see FIGS. 4A-B). Alternatively, in some implementations, at least two of the scan flip-flops 410A-B and 420A-B may be arranged to receive different signals SE (see FIGS. 4A-B). For ease of description, control signals and/or data signals that are used to drive the scan flip-flops 410A-B and 420A-B, such as the signals SE and SI, are omitted from FIG. 5, as the exact implementation of the scan chain (which the memory device 150 is integrated into) can vary.

According to the example of FIG. 5, the reset monitor 158 may include an AND gate 512 and one or more NOT gates 514. The output port Q of each of the flip-flops 304 may be a coupled to a different input port of the AND gate 512. The output port Q of each of the flip-flops 306 may be coupled to a different input port of the to an AND gate 514 via a respective NOT gate 514. As a result of this arrangement, the signal output from each of the flip-flops 306 is provided to the AND gate 512 without being inverted, whereas the signal output from each of the flip-flops 304 is inverted before it is provided to the AND gate 512. Accordingly, when each of the flip-flops 304 and 306 is set/reset correctly, after the RESET_DIGITAL signal 154 is set to the predetermined value, the RESET_OK signal 162, which is output from the AND gate 512, may have a first value (e.g., a logic-high value). By contrast, when one or more of flip-flops 304 and 306 is not set/reset correctly (e.g., due to a fault in the flip-flop), the RESET_OK signal 162, which is output from the AND gate 512 may have a second value (e.g., a logic-low value).

In some implementations, when the memory device 150 is part of a scan chain, the RESET_OK signal 162 may be supplied to the circuitry 114 via a 2-to-1 multiplexer 502. One of the input ports of the multiplexer 502 may be arranged to receive the RESET_OK signal 162 and the other one of the input ports of the multiplexer 502 may be arranged to receive a predetermined fixed-value signal (e.g., a signal that is set to either a logic-low value or a logic-high value). The selection port of the multiplexer 502 may be arranged to receive a SCAN_MODE signal. When the SCAN_MODE signal is set to is set to a logic-high value, the fixed-value signal (either '0' or '1') is passed through the multiplexer 502, while the RESET_OK signal is blocked at the multiplexer 502. By contrast, when the SCAN_MODE signal is set to a logic-low value, the RESET_OK signal 162 may be passed through the multiplexer 502 to reach the circuitry 114.

The SCAN_MODE signal may be further used by the scan chain (which the memory device 150 is part of) to enable the signal SE that is supplied to the scan flip-flops 410A-B and 420A-B. As is known in the art, the signal SE may be used to switch the scan chain between different operational stages, such as a shift stage and a capture stage. Those of ordinary skill in the art would readily recognize how to use the scan flip flops 410A and 420B to implement a scan chain, as scan chains that lack a reset monitor circuit (and/or the memory device 150) are well-understood and frequently used to detect manufacturing defects in hardware. In this regard, it will be understood that the present disclosure is not limited to using the reset monitor circuit 156 and/or memory device 150 in conjunction with any specific scan chain implementation.

FIGS. 1A-5 are provided as an example only. Although the scan chain 150 is presented in the context of a sensor, it will be understood that alternative implementations are possible in which the scan chain 150 is used any suitable type of integrated circuit, such as a general-purpose processor, an application-specific integrated circuit, a digital signal processor, etc. Although in the example of FIGS. 1A-5 the flip flops 304 and 306 are positive-edge triggered and use a logic-high reset signal (i.e., they are reset when the reset signal is set to a logic-high value), alternative implementations are possible in which any of the flip-flops 304 and 306 is negative-edge triggered and/or uses a logic-low reset signal.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid-state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A system, comprising:
   a plurality of flip-flops that are configured to receive a reset signal, each of the plurality of flip-flops having a respective output port, and each of the plurality of flip-flops being configured to assume a respective default state when the reset signal is set to a predetermined value; and
   a reset monitor circuit that is coupled to the respective output port of each of the plurality of flip-flops, the reset monitor circuit being configured to generate a status signal indicating whether each of the flip-flops has assumed the flip-flop's respective default state after the reset signal is set to the predetermined value,
wherein assuming a respective default state by each of the plurality of flip-flops results in a predetermined bit string being stored in the plurality of flip-flops.

2. The system of claim 1, wherein the respective default state of at least one of the plurality of flip-flops includes a first state and the respective default state of at least another one of the plurality of flip-flops includes a second state that is different from the first state.

3. The system of claim 1, wherein the predetermined bit string includes one or more 1s and one or more 0s.

4. The system of claim 1, wherein the plurality of flip-flops and the reset monitor circuit are part of a scan chain for testing the system.

5. The system of claim 1, wherein:
each of the plurality of flip-flops is configured to output a respective output signal via the flip-flop's respective output port;
the respective output signal of at least one of the plurality of flip-flops is inverted prior to being processed by the reset monitor circuit, and the respective output signal of at least another one of the plurality of flip-flops is not inverted prior to being processed by the reset monitor circuit.

6. The system of claim 1, wherein the plurality of flip-flops includes one or more type-1 flip-flops and one or more type-2 flip-flops, such that:
(i) each of the type-1 flip-flops includes a reset port that is arranged to receive the reset signal, and the default state of each of the plurality of type-1 flip-flops includes a state in which the type-1 flip-flop outputs an output signal having a logic-low value;
(ii) each of the type-2 flip-flops includes a set port that is arranged to receive the reset signal, and the default state of each of the plurality of type-2 flip-flops includes a state in which the type-2 flip-flop outputs an output signal having a logic-high value.

7. The system of claim 1, further comprising a transducer that is operatively coupled to a signal processing circuitry, wherein the plurality of flip-flops and the reset monitor circuit are part of a scan chain for testing the signal processing circuitry.

8. The system of claim 1, wherein each of the plurality of flip-flops includes a D-type flip-flop.

9. The system of claim 1, further comprising a testing circuitry configured to:
detect whether the reset signal is set to the predetermined value; and
transition the system into a predetermined state when the status signal generated by the reset monitor circuit indicates that at least one of the plurality of flip-flops has failed to assume the flip-flop's respective default state in response to the reset signal being set to the predetermined value.

10. The system of claim 9, wherein transitioning the system into the predetermined state includes outputting a signal indicating that one or more of the plurality of flip-flops have failed.

11. A system, comprising:
a plurality of flip-flops that are configured to receive a reset signal, each of the plurality of flip-flops having a respective output port, and each of the plurality of flip-flops being configured to assume a respective default state when the reset signal is set to a predetermined value;
a reset monitor circuit that is coupled to the respective output port of each of the plurality of flip-flops, the reset monitor circuit being configured to generate a status signal indicating whether each of the flip-flops has assumed the flip-flop's respective default state after the reset signal is set to the predetermined value; and
a testing circuitry configured to detect whether the reset signal is set to the predetermined value, and transition the system into a predetermined state when the status signal generated by the reset monitor circuit indicates that at least one of the plurality of flip-flops has failed to assume the flip-flop's respective default state in response to the reset signal being set to the predetermined value.

12. The system of claim 11, wherein transitioning the system into the predetermined state includes outputting a signal indicating that one or more of the plurality of flip-flops have failed.

13. The system of claim 11, wherein assuming a respective default state by each of the plurality of flip-flops results in a predetermined bit string being stored in the plurality of flip-flops.

14. The system of claim 11, wherein the plurality of flip-flops includes one or more type-1 flip-flops and one or more type-2 flip-flops, such that:
(i) each of the type-1 flip-flops includes a reset port that is arranged to receive the reset signal, and the default state of each of the plurality of type-1 flip-flops includes a state in which the type-1 flip-flop outputs an output signal having a logic-low value;
(ii) each of the type-2 flip-flops includes a set port that is arranged to receive the reset signal, and the default state of each of the plurality of type-2 flip-flops includes a state in which the type-2 flip-flop outputs an output signal having a logic-high value.

15. The system of claim 11, wherein the plurality of flip-flops and the reset monitor circuit are part of a scan chain for testing the system.

16. A sensor comprising:
a transducer;
a processing circuitry coupled to the transducer, the processing circuitry being configured to digitally process a signal that is generated using the transducer;
a plurality of flip-flops that are configured to receive a reset signal, each of the plurality of flip-flops having a respective output port, and each of the plurality of flip-flops being configured to assume a respective default state when the reset signal is set to a predetermined value; and
a reset monitor circuit that is coupled to the respective output port of each of the plurality of flip-flops, the reset monitor circuit being configured to generate a status signal indicating whether each of the flip-flops has assumed the flip-flop's respective default state after the reset signal is set to the predetermined value;
a testing circuitry configured to detect whether the reset signal is set to the predetermined value, and transition the sensor into a predetermined state when the status signal indicates that at least one of the plurality of flip-flops has failed to assume the flip-flop's respective default state in response to the reset signal being set to the predetermined value,
wherein assuming a respective default state by each of the plurality of flip-flops results in the plurality of flip-flops being transitioned into a state in which a predetermined bit string is stored in the plurality of flip-flops.

17. The sensor of claim 16, wherein transitioning the sensor into the predetermined state includes outputting a signal indicating that one or more of the plurality of flip-flops have failed.

18. The sensor of claim 16, wherein the respective default state of at least one of the plurality of flip-flops includes a first state and the respective default state of at least another one of the plurality of flip-flops includes a second state that is different from the first state.

19. The sensor of claim 16, wherein:
   each of the plurality of flip-flops is configured to output a respective output signal via the flip-flop's respective output port;
   the respective output signal of at least one of the plurality of flip-flops is inverted prior to being processed by the reset monitor circuit, and the respective output signal of at least another one of the plurality of flip-flops is not inverted prior to being processed by the reset monitor circuit.

20. The sensor of claim 16, wherein the plurality of flip-flops includes one or more type-1 flip-flops and one or more type-2 flip-flops, such that:
   (i) each of the type-1 flip-flops includes a reset port that is arranged to receive the reset signal, and the default state of each of the plurality of type-1 flip-flops includes a state in which the type-1 flip-flop outputs an output signal having a logic-low value;
   (ii) each of the type-2 flip-flops includes a set port that is arranged to receive the reset signal, and the default state of each of the plurality of type-2 flip-flops includes a state in which the type-2 flip-flop outputs an output signal having a logic-high value.

\* \* \* \* \*

UNITED STATES PATENT AND TRADEMARK OFFICE
CERTIFICATE OF CORRECTION

PATENT NO. : 11,128,282 B2
APPLICATION NO. : 16/780324
DATED : September 21, 2021
INVENTOR(S) : Sergio Nicolás Deligiannis et al.

It is certified that error appears in the above-identified patent and that said Letters Patent is hereby corrected as shown below:

In the Specification

Column 1, Line 64 delete "including plurality" and replace with --including a plurality--.

Column 4, Line 66 delete "RESET signal 154" and replace with --RESET_DIGITAL signal 154--.

Column 6, Line 34 delete "which stores" and replace with --which it stores--.

Column 6, Line 44 delete "of the to an" and replace with --of the--.

Column 6, Line 50 delete "RESET signal 154" and replace with --RESET_DIGITAL signal 154--.

Column 7, Line 23 delete "gates 314" and replace with --gates 326--.

Column 7, Line 34 delete "device includes" and replace with --device 150 includes--.

Column 7, Line 50 delete "four flip flops 304 and at least four flops 306" and replace with --four flip-flops 304 and at least four flip-flops 306--.

Column 8, Line 40 delete "ASIL D" and replace with --ASIL-D--.

Column 9, Line 17 delete ": Scan-in," and replace with --: scan-in,--.

Column 9, Line 25 delete ", may be" and replace with --and may be--.

Column 9, Line 50 delete "which stores" and replace with --which it stores--.

Column 10, Lines 7-8 delete "may be a coupled" and replace with --may be coupled--.

Column 10, Line 10 delete "of the to an" and replace with --of the--.

Signed and Sealed this
Twenty-fifth Day of July, 2023

Katherine Kelly Vidal
*Director of the United States Patent and Trademark Office*

Column 10, Line 35 delete "is set to is set to" and replace with --is set to--.

Column 10, Line 55 delete "circuit 156" and replace with --158--.

Column 11, Line 13 delete "solved." and replace with --sold.--.

Column 11, Line 53 delete "components the" and replace with --components, the--.